US010007588B2

(12) United States Patent
Shao et al.

(10) Patent No.: US 10,007,588 B2
(45) Date of Patent: Jun. 26, 2018

(54) FULL ADDRESS COVERAGE DURING MEMORY ARRAY BUILT-IN SELF-TEST WITH MINIMUM TRANSITIONS

(71) Applicant: FREESCALE SEMICONDUCTOR, INC., Austin, TX (US)

(72) Inventors: Botang Shao, Austin, TX (US); Timothy J. Strauss, Granger, IN (US); Thomas Jew, Austin, TX (US); Edward Bryann C. Fernandez, Austin, TX (US)

(73) Assignee: NXP USA, Inc., Austin, TX (US)

( * ) Notice: Subject to any disclaimer, the term of this patent is extended or adjusted under 35 U.S.C. 154(b) by 96 days.

(21) Appl. No.: 15/005,537

(22) Filed: Jan. 25, 2016

(65) Prior Publication Data
US 2017/0213601 A1     Jul. 27, 2017

(51) Int. Cl.
| G06F 11/00 | (2006.01) |
| G06F 11/27 | (2006.01) |
| G06F 11/263 | (2006.01) |
| G06F 11/273 | (2006.01) |
| G11C 29/14 | (2006.01) |
| G11C 29/18 | (2006.01) |
| G11C 29/12 | (2006.01) |

(52) U.S. Cl.
CPC ............ *G06F 11/27* (2013.01); *G06F 11/263* (2013.01); *G06F 11/273* (2013.01); *G11C 29/14* (2013.01); *G11C 29/18* (2013.01); *G11C 2029/1206* (2013.01)

(58) Field of Classification Search
CPC ........ G11C 29/12; G06F 11/27; G06F 11/263; G06F 11/273; G06F 12/10
See application file for complete search history.

(56) References Cited

U.S. PATENT DOCUMENTS

| 6,425,103 | B1 | 7/2002 | Phan |
| 2004/0010536 | A1 | 1/2004 | Moreno et al. |
| 2004/0044492 | A1* | 3/2004 | Ichikawa ......... G11C 29/12015 702/118 |
| 2011/0209012 | A1* | 8/2011 | Tiwary ................... G11C 29/18 714/718 |

(Continued)

OTHER PUBLICATIONS

Van De Goor et al, "New Algorithms for Address Decoder Delay Faults and Bit Line Imbalance Faults", Asian Test Symposium, Nov. 23-26, 2009, pp. 391-396.

(Continued)

*Primary Examiner* — Philip A Guyton

(57) ABSTRACT

A method and apparatus for generating an address sequence in a memory device is provided. The method includes providing a memory array having a set of unique addresses, storing one of a first subset of the set of unique addresses in a first storage element, storing one of a second subset of the set of unique addresses in a second storage element, and generating a sequence of addresses to test the memory array. The sequence of addresses are formed by alternately outputting addresses stored in the first storage element and the second storage element such that the sequence of addresses causes each unique address of the set to transition only once. The sequence of addresses can be used to efficiently test the memory array during a built-in self-test (BIST).

19 Claims, 4 Drawing Sheets

(56) References Cited

U.S. PATENT DOCUMENTS

2017/0092380 A1* 3/2017 Fernandez ............ G11C 29/36

OTHER PUBLICATIONS

Thimbleby, "The Directed Chinese Postman Problem", Middlesex University School of Computing Science Technical Report, Apr. 1999, pp. 1-17.
Wu, Memory Testing and Built-In Self-Test, VLSI test principles and architectures: design for testability, Academic Press, 2006, pp. 461-555.

* cited by examiner

| NUMBER OF DECODED ADDRESSES | NUMBER OF REGISTER BITS USED | NX(N-1) / NUMBER OF TRANSITIONS REACHED |
|---|---|---|
| 4 | 6 | 1 |
| 16 | 12 | 1 |
| 64 | 18 | 1 |
| 256 | 24 | 1 |
| 1024 | 30 | 1 |
| 512 x 1024 | 57 | 1 |

US 10,007,588 B2

FULL ADDRESS COVERAGE DURING MEMORY ARRAY BUILT-IN SELF-TEST WITH MINIMUM TRANSITIONS

BACKGROUND

Field

This disclosure relates generally to integrated circuits, and more particularly, to covering all addresses and all transitions between any two unique addresses in a memory array while minimizing transition time between addresses during built-in self-test.

Related Art

Memory devices include an array of memory cells that are addressed on a row by column basis. Many memory devices include built-in self-test (BIST) logic that is used to determine whether the memory cells in the array are functioning properly. Due to the large number of cells in the array, the time required to address and test each cell individually is prohibitively long, so a subset of the cells is typically tested instead. If all of the cells in the chosen subset pass BIST, it is assumed that the remaining cells will also pass BIST. Under some circumstances, it is desirable to test all of the cells in the array, while minimizing the time required to test the memory cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of memory devices and methods disclosed herein generate an address sequence to transition from one address to another during built-in self-test (BIST). The address sequence uses the minimum number of address transitions while exercising all switching between decoder lines to expose all possible transition faults in minimum execution time. Each output of a decoder is accessed only once for every address sequence from source to destination nodes. The circuitry to implement the address sequence logic includes two multiplexers and a simple state machine that uses source and destination indices to determine the address sequence. The indices for the address sequencing can be stored in registers, with the number of registers required ranging from six register bits for a system with four decoded addresses (nodes) to fifty-seven register bits for a system with 512 times 1024 decoded addresses. Thus, the circuitry required to determine the BIST address sequence uses minimal circuitry and storage.

Figure 1:
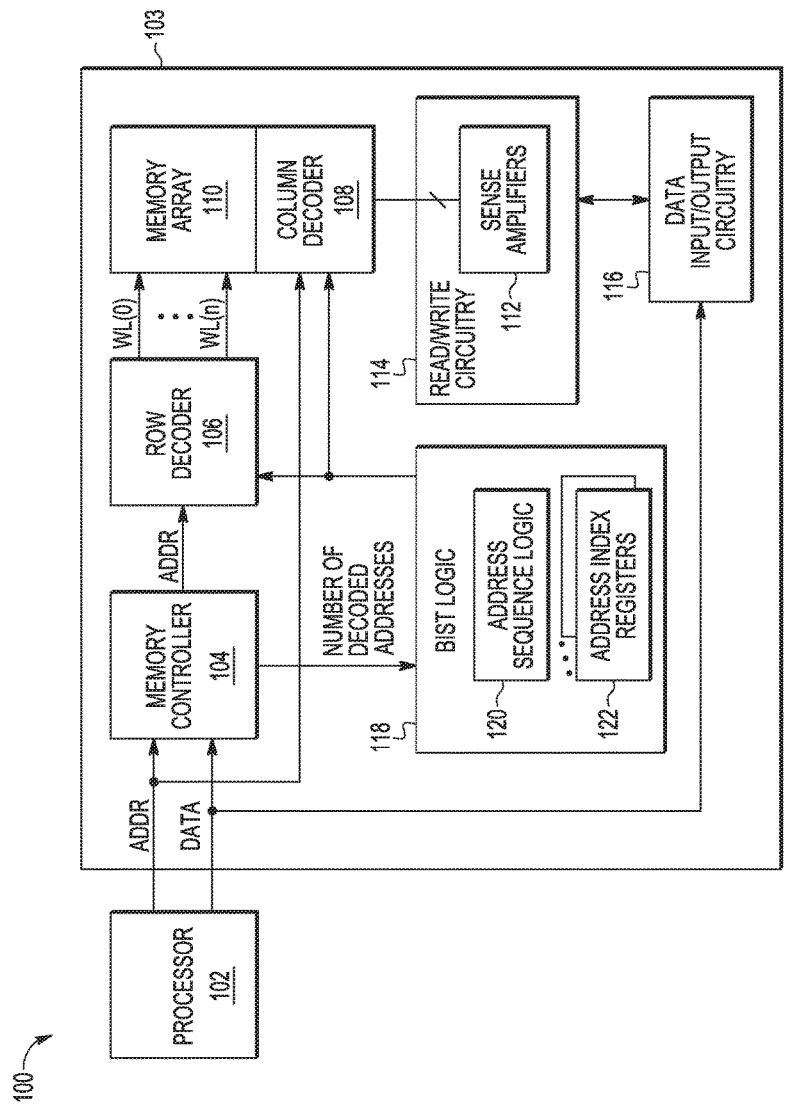
FIG. 1 illustrates a block diagram of an embodiment of a memory device.

Shown in FIG. 1 is a block diagram of an embodiment of a processing system 100 including processor 102 coupled to memory device 103 that includes memory cell array 110, memory controller 104, a row decoder 106 coupled to array 110 and memory controller 104, a column decoder 108 coupled to array 110 and memory controller 104, and BIST logic 118 coupled to memory controller 104, row decoder 106 and column decoder 108. BIST logic 118 includes address sequence logic 120 and address index registers 122.

Memory controller 104 provides addresses and control signals to access array 110 by directing the operations of row decoder 106, column decoder 108, and memory read/write circuitry 114 including sense amplifiers 112. Memory cells in array 110 are selected for reading or writing with output from row decoder 106 and column decoder 108. Read/write circuitry performs the read and write operations. Input/output circuitry 116 provides data signals to read/write circuitry 114 and receives data signals from read/write circuitry 114. Read/write circuitry 114 includes one or more sense amplifiers 112 coupled to column decoder 108 to sense the voltage on bit lines coupled to the memory cells in array 110 during read operations. Row decoder 106 provides signals on word lines WL(0:n), where each word line is coupled to a row of memory cells in array 110. Column decoder 108 provides signals on pairs of true and complementary bit lines (not shown) coupled to respective columns of memory cells in array 110. Read and write operations are performed on memory cells in array 110 by controlling signals on corresponding word lines and bit lines.

BIST logic 118 includes address sequence logic 120 and address index registers 122. Address sequence logic 120 uses a source index and a destination index to determine a sequence of address transitions that tests all the addresses in the memory array 110 without duplicating any of the transitions. Address index registers 122 are used to store the source and destination indices. The number of registers 122 required depends on the number of bits in each register and the size of memory array 110. An array with N addresses or nodes will require ceiling($\log_2(N)$) register bits to store an output update, ceiling($\log_2(N)$) register bits to store the source index, and ceiling($\log_2(N-1)$) register bits to store the destination index, where ceiling represents a ceiling function that maps a real number to the smallest following integer.

During BIST, address information from BIST logic 118 is used by row decoder 106 and column decoder 108. During normal operation, row decoder 106 and column decoder 108 use address information from memory controller 104.

Figure 2:
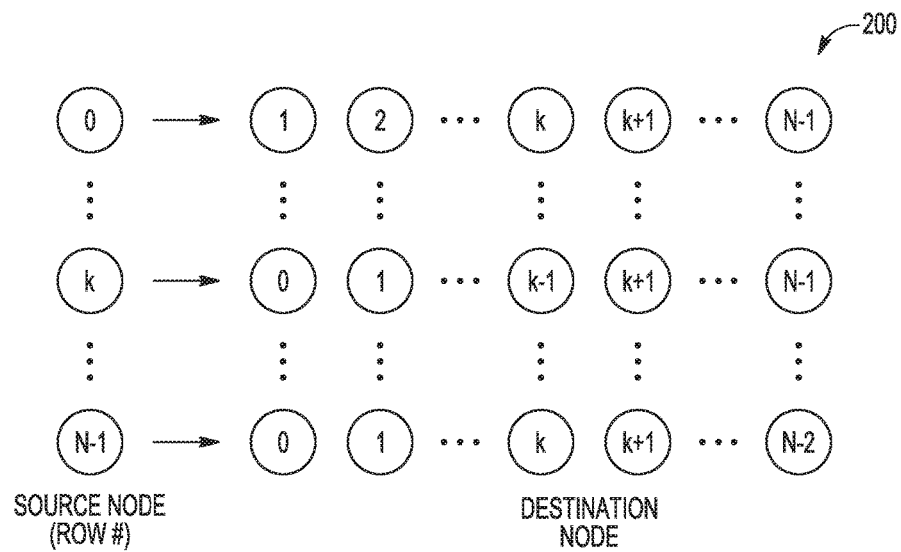
FIG. 2 illustrates an example of source and destination nodes for transitioning between addresses during built-in self-test of a memory array.

Referring to FIGS. 1 and 2, FIG. 2 illustrates an example of source and destination nodes for each source node 200 for transitioning between addresses during built-in self-test of a memory array. Source nodes include rows from 0 to N-1, where N is the number of nodes or addresses in memory array 110. For each source node, there are N-1 destination nodes since no transition is required when the source node equals the destination node. Accordingly, source node 0 does not transition to destination node 0, source node 1 does not transition to destination node 1, source node 2 does not transition to destination node 2, etc. Overall, there will be N times (N-1) transitions, with each node being reached only once, which is the minimum possible number of transitions to reach all addresses and all transitions between any two unique addresses.

Figure 3:
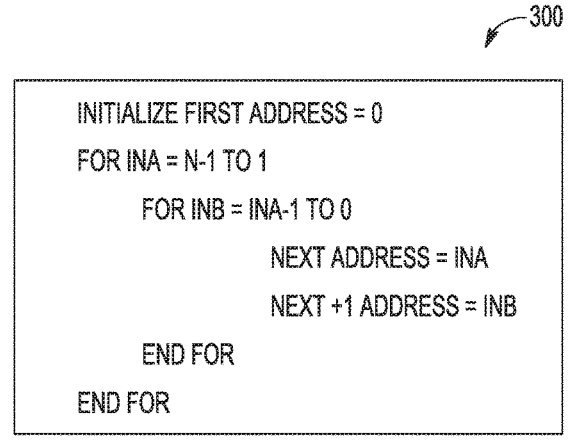
FIG. 3 illustrates an embodiment of address sequence logic that can be used in the memory device of FIG. 1.

FIG. 3 illustrates an embodiment of address sequence logic 120 that can be used in memory device 103 of FIG. 1. Before iterative outer and inner loops are performed to sequence through the nodes, a first address or node is initialized to zero. An outer loop iterates outer loop index INA from (N−1) to 1, and an inner loop iterates an inner loop index INB from (INA−1) to 0. In the inner loop, a NEXT address is set to outer loop index INA and a subsequent next address (NEXT+1) address is set to inner loop index INB. The NEXT and NEXT+1 addresses are stored in address index registers 122 and used to provide address information to row decoder 106 and column decoder 108 every clock cycle during the BIST test. In this manner, only the outer and inner loop indices (INA and INB), and an update address, need to be stored in address index registers 122 each clock cycle.

Figure 4:
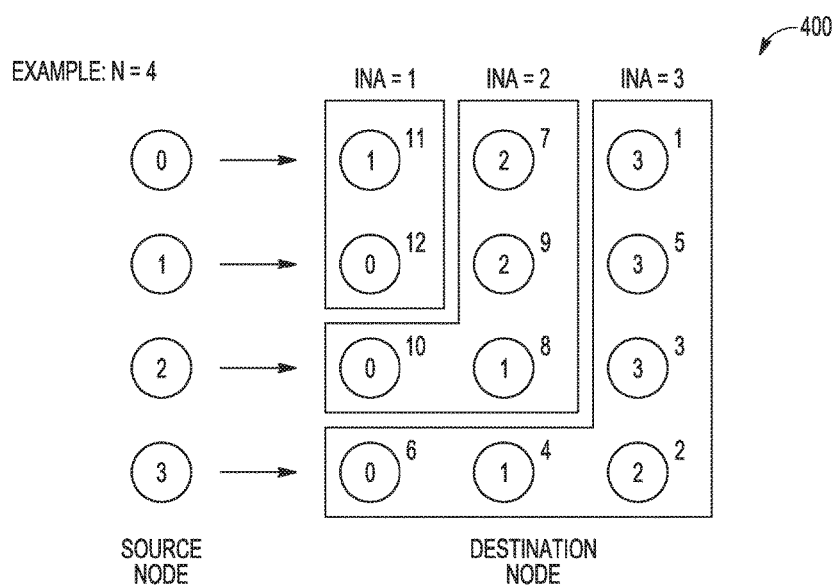
FIG. 4 illustrates an example of an address sequence between source and destination nodes that can be used during built-in self-test when all memory address transitions are exercised.

Referring to FIGS. 3 and 4, FIG. 4 illustrates an example of an address sequence 400 between source and destination nodes that is generated with address sequence logic 120 (FIG. 1) during built-in self-test when all memory address transitions are exercised for a memory array with four address or nodes. The table shown in FIG. 4 includes numbers in circles that indicate the possible destination node transitions for each source node. Source node 0 can transition to destination nodes 1, 2 and 3. Source node 1 can transition to destination nodes 0, 2 and 3. Source node 2 can transition to destination nodes 0, 1 and 3. Source node 3 can transition to destination nodes 0, 1 and 2. Outer loop index INA varies between 3 and 1, and inner loop index INB varies between 2 and 0. In the first iteration of the outer loop, outer loop index INA is 3, and inner loop index INB is set to the values of 2, 1, and 0 during the inner loop iterations. In the second iteration of the outer loop, outer loop index INA is 2, and inner loop index INB is set to the values of 1, and 0 during the inner loop iterations. In the third iteration of the outer loop, outer loop index INA is 1, and inner loop index INB is set to the value of 0 during the inner loop iteration.

The resulting address sequence of NEXT address and NEXT+1 address, beginning with node 0, is 0→3→2→3→1→3→0→2→1→2→0→1→0. The small superscript numbers next to the circled numbers indicate the transition sequence. From source node 0, the transition is to destination node 3. The destination node then becomes the source node for the second transition from source node 3 to destination node 2. The third transition is from source node 2 to destination node 3. The fourth transition is from source node 3 to destination node 1. The fifth transition is from source node 1 to destination node 3, and so on, until a transition to all nodes has been made according to the address sequence.

Figure 5:
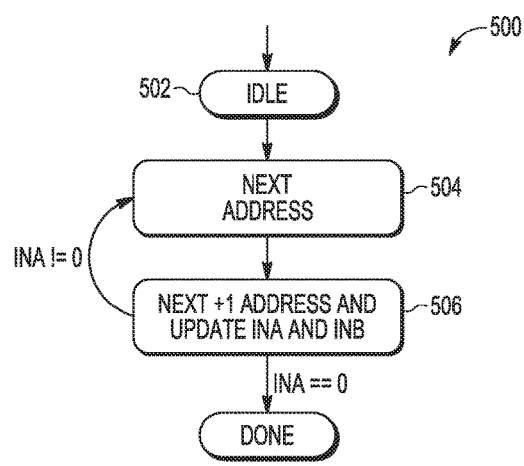
FIG. 5 illustrates an example of a state diagram for determining the address sequence during built-in self-test of the array.
Figures 6, 7:
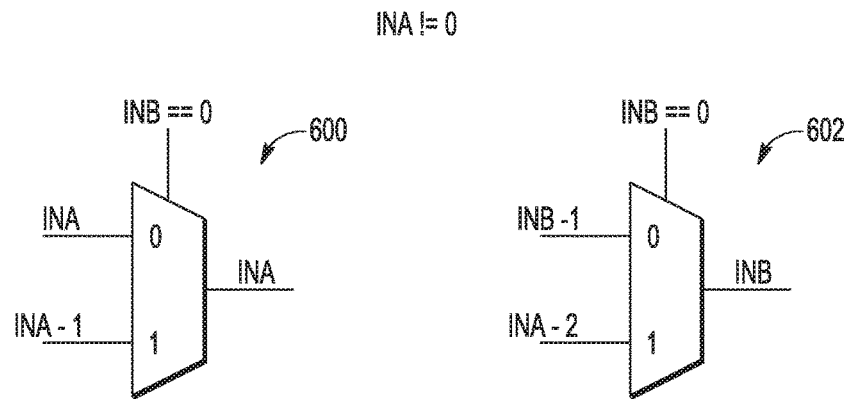
FIG. 6 illustrates an embodiment of circuitry that can be used to implement a portion of the address sequence logic of FIG. 3.
FIG. 7 lists examples of register space required to implement the address sequence logic of FIG. 3 for various memory array sizes.

Referring to FIGS. 4, 5 and 6, FIG. 5 illustrates an example of a state diagram 500 for determining the address sequence during built-in self-test of the array. From IDLE state 502, a transition to state 504 is made when BIST begins. State 504 sets the NEXT address to outer loop index INA and transitions to state 506. State 506 sets the NEXT+1 address to the inner loop index INB.

While in state 506, the inner loop index INB and the outer loop index INA are updated for the next iteration. FIG. 6 illustrates an embodiment of circuitry including multiplexers 600 and 602 that can be used to implement a portion of address sequence logic 120 (FIG. 1) to update inner loop index INB and outer loop index INA. Multiplexer 600 includes a first input coupled to outer loop index INA and a second input coupled to outer loop index INA decremented by one (INA−1). An output of multiplexer 600 provides an updated value for outer loop index INA. A control input of multiplexer 600 is coupled to a result of a logic expression that determines whether the inner loop index INB is equal to zero (INB==0). If the inner loop index INB is equal to zero, the outer loop index INA is decremented by being set equal to the second input of multiplexer 600 (INA−1). If the inner loop index INB is not equal to zero, the updated value of outer loop index INA remains the same by being set equal the first input of multiplexer 600 (INA).

Multiplexer 602 includes a first input coupled to an inner loop index INB decremented by one (INB−1), and a second input coupled to outer loop index INA decremented by two (INA−2). An output of multiplexer 602 provides an updated value for inner loop index INB. A control input of multiplexer 602 is coupled to a result of a logic expression that determines whether the inner loop index INB is equal to zero (INB==0). If the inner loop index INB is not equal to zero, the inner loop index INB is decremented by being set equal to the first input of multiplexer 602 (INB−1). If the inner loop index INB is equal to zero, the updated value of inner loop index INB is set equal the second input of multiplexer 602 (INA−2).

Referring again to FIG. 5, when the outer loop index INA is equal to zero (INA==0), the address sequence has been determined and state 506 transitions to state 508, which end the state machine 500. When the outer loop index is not equal to zero, state 506 transitions to state 504 to continue determining the address sequence with the update values of the inner and outer loop indexes INA and INB.

FIG. 7 illustrates examples of register space required in address index registers 122 (FIG. 1) to implement the address sequence logic of FIG. 3 for various memory array sizes. For a memory array with four addresses, six register bits are required; four bits to store both the inner and outer loop indices (INA and INB), and two bits to store a current address in the transition sequence. For a memory array with sixteen addresses, twelve register bits are required; 8 bits to store both the inner and outer loop indices (INA and INB), and four bits to store the current address in the transition sequence. For a memory array with sixty-four addresses, eighteen register bits are required; 12 bits to store both the inner and outer loop indices (INA and INB), and six bits to store the current address in the transition sequence. For a memory array with two-hundred and fifty-six addresses, twenty-four register bits are required; 16 bits to store both the inner and outer loop indices (INA and INB), and eight bits to store the current address in the transition sequence. For a memory array with one thousand twenty-four addresses, thirty register bits are required; 20 bits to store both the inner and outer loop indices (INA and INB), and ten bits to store the current address in the transition sequence. For a memory array with five hundred twelve times one thousand twenty four addresses, fifty-seven register bits are required; 38 bits to store both the inner and outer loop indices (INA and INB), and nineteen bits to store the current address in the transition sequence.

By now it should be appreciated that embodiments of memory devices and methods have been disclosed that provide an area-efficient integrated circuit to generate address transition sequences during BIST. The disclosed embodiments achieve 100% test coverage of the memory array with the minimum number of address changes and a minimum amount of circuitry and storage required to implement the logic to generate and use the address sequence.

In some embodiments there has been disclosed a method for generating an address sequence in a memory device that can comprise providing a memory array (110) having a set of unique addresses; storing one of a first subset (INA: N−1 to 1) of the set of unique addresses in a first storage element (122), the first storage element external to the memory array; storing one of a second subset (INB: INA−1 to 0) of the set of unique addresses in a second storage element (122), the second storage element external to the memory array; and generating a sequence of addresses (FIG. 4) to test the memory array. The sequence of addresses are formed by alternately outputting (504, 506) addresses stored in the first storage element and the second storage element. The sequence of addresses causes each unique address of the set to transition only once.

In another aspect, the method can further comprise providing a processing element (120) coupled to the first and second storage elements and coupled to provide addresses to the memory array.

In another aspect, the method can further comprise coupling the processing element to a row decoder (106) and to a column decoder (108) of the memory array.

In another aspect, the processing element is characterized as a state machine and included in a built-in self-test (BIST) logic block (118).

In another aspect, generating a sequence of addresses to test the memory array further comprises generating a sequence of addresses to test the memory array during a BIST mode of the memory array.

In another aspect, a first portion (FIG. 4, INA=3, sequence=3, 2, 3, 1, 3, 0) of the sequence of addresses includes one address (FIG. 4, address 3) from the first subset interleaved among a plurality of addresses (FIG. 4, addresses 2, 1, 0) from the second subset, each of the addresses in the plurality of addresses from the second subset different from each other and different from the one address from the first subset.

In another aspect, the set of unique addresses is a set of unique decoded addresses.

In another aspect, the method can further comprise using a memory controller (104), providing addresses to the memory array during a normal operating mode.

In another aspect, the number of addresses in the first subset and the number of addresses in the second subset are the same (N−1 to 1 same number of addresses as INA−1 to 0).

In other select embodiments, a memory device can comprise a memory array (110) having a set of unique addresses; a first storage element (122) external to the memory array; a second storage element (122) external to the memory array; and a processing element (120) coupled to the first storage element and to the second storage element and coupled to provide addresses to the memory array. The processing element iteratively outputs addresses stored in the first storage element and the second storage element to form a sequence of addresses. The sequence of addresses causing each unique address in the set to transition only once.

In another aspect, a first address (INA) of a first subset (N−1 to 1) of the set of unique addresses is stored in the first storage element and a second address (INB) of a second subset (INA−1 to 0) of the set of unique addresses is stored in the second storage element.

In another aspect, the sequence of addresses includes the first address (FIG. 4, INA=3, addr=3) directly followed by the second address (FIG. 4, INA=3, addr=2), and the second address directly followed by the first address (FIG. 4, INA=3, addr=3).

In another aspect, the first storage element and the second storage element are each characterized as a register (122).

In another aspect, the processing element to iteratively output addresses stored in the first storage element and the second storage element to form a sequence of addresses further comprises alternately outputting address stored in the first storage element and the second storage element to form the sequence of address (FIG. 4, INA=3, sequence=$3^{1st}$, $2^{2nd}$, $3^{1st}$, $1^{2nd}$, $3^{1st}$, $0^{2nd}$).

In another aspect, the memory device can further comprise a row decoder (106) and a column decoder (108) each coupled to the memory array, the row decoder and the column decoder coupled to the processing element to receive the sequence of addresses during a test mode.

In another aspect, the memory device can further comprise a built-in self-test (BIST) logic block (118), the BIST logic block including the first storage element (122), the second storage element (122), and the processing element (120).

In another aspect, the processing element is characterized as a state machine.

In other selected embodiments, a method for generating an address sequence in a memory device can comprise providing a memory array (110) having a set of unique addresses; storing one address (INA) of a first subset (N−1 to 1) of the set of unique addresses in a first storage element (122), the first storage element external to the memory array; storing one address (INB) of a second subset (INA−1 to 0) of the set of unique addresses in a second storage element (122), the second storage element external to the memory array; outputting the address stored in the first storage element (504); outputting the address stored in the second storage element (506); updating the address in the second storage element with a next address of the second subset (INA !=0); and iteratively repeating the steps of outputting the address stored in the first storage element, outputting the address stored in the second storage element, and updating the address in the second storage element, until the second storage element has been updated with a predetermined number of next addresses (INB==0) to generate a first sequence of addresses.

In another aspect, the method can further comprise, after generating the first sequence of addresses, updating the address (506) in the first storage element with a next address of the first subset; and iteratively repeating the steps of outputting the address stored in the first storage element, outputting the address stored in the second storage element, and updating the address in the second storage element, until the second storage element has been updated with a predetermined number of next addresses (INB==0) to generate a second sequence of addresses.

In another aspect, the first sequence and the second sequence are a first and second portion (INA !=0) of a sequence of addresses, the sequence of addresses causing each unique address in the set of unique addresses of the memory array to transition only once (INA==0, 508).

Although the invention is described herein with reference to specific embodiments, various modifications and changes can be made without departing from the scope of the present invention as set forth in the claims below. For example, the particular type of non-volatile resistive element can vary from that disclosed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for generating an address sequence in a memory device, the method comprising:
    providing a memory array having a set of unique addresses;
    storing one of a first subset of the set of unique addresses in a first storage element, the first storage element external to the memory array;
    storing one of a second subset of the set of unique addresses in a second storage element, the second storage element external to the memory array;
    generating a sequence of addresses to test the memory array, the sequence of addresses formed by alternately outputting addresses stored in the first storage element and the second storage element, wherein adjacent addresses in the sequence of addresses create a corresponding transition pair of a source address and a destination address, wherein each unique address of the set is the source address in multiple transition pairs and each pair of the multiple transition pairs that has the same unique address as a source address has a different one of other unique address of the set as the destination address; and
    testing the memory array with the generated sequence of addresses during built-in self-test (BIST) mode of the memory array with a minimum number of address changes.

2. The method of claim 1, further comprising providing a processing element coupled to the first and second storage elements and coupled to provide addresses to the memory array.

3. The method of claim 2, further comprising coupling the processing element to a row decoder and to a column decoder of the memory array.

4. The method of claim 2, wherein the processing element is characterized as a state machine and included in a built-in self-test (BIST) logic block.

5. The method of claim 1, wherein a first portion of the sequence of addresses includes one address from the first subset interleaved among a plurality of addresses from the second subset, each of the addresses in the plurality of addresses from the second subset different from each other and different from the one address from the first subset.

6. The method of claim 1, wherein the set of unique addresses is a set of unique decoded addresses.

7. The method of claim 1, further comprising using a memory controller, providing addresses to the memory array during a normal operating mode.

8. The method of claim 1, wherein the number of addresses in the first subset and the number of addresses in the second subset are the same.

9. A memory device, comprising:
    a memory array having a set of unique addresses;
    a first storage element external to the memory array;
    a second storage element external to the memory array; and
    a processing element coupled to the first storage element and to the second storage element and coupled to provide addresses to the memory array, the processing element to iteratively output addresses stored in the first storage element and the second storage element to form a sequence of addresses, and to test the memory array with the generated sequence of addresses during built-in self-test (BIST) mode of the memory array with a minimum number of address changes, wherein adjacent addresses in the sequence of addresses create a corresponding transition pair of a source address and a destination address, wherein each unique address in the set is the source address in multiple transition pairs and each of the multiple transition pairs having a same unique address of the set as the source address has a different one of other unique address of the set as the destination address.

10. The memory device of claim 9, wherein a first address of a first subset of the set of unique addresses is stored in the first storage element and a second address of a second subset of the set of unique addresses is stored in the second storage element.

11. The memory device of claim 10, wherein the sequence of addresses includes the first address directly followed by the second address, and the second address directly followed by the first address.

12. The memory device of claim 9, wherein the first storage element and the second storage element are each characterized as a register.

13. The memory device of claim 9, wherein the processing element to iteratively output addresses stored in the first storage element and the second storage element to form a sequence of addresses further comprises alternately outputting address stored in the first storage element and the second storage element to form the sequence of address.

14. The memory device of claim 9, further comprising a row decoder and a column decoder each coupled to the memory array, the row decoder and the column decoder coupled to the processing element to receive the sequence of addresses during a test mode.

15. The memory device of claim 9, further comprising a built-in self-test (BIST) logic block, the BIST logic block including the first storage element, the second storage element, and the processing element.

16. The memory device of claim 9, wherein the processing element is characterized as a state machine.

17. A method for generating an address sequence in a memory device, the method comprising:
    providing a memory array having a set of unique addresses;
    storing one address of a first subset of the set of unique addresses in a first storage element, the first storage element external to the memory array;

storing one address of a second subset of the set of unique addresses in a second storage element, the second storage element external to the memory array;

outputting the address stored in the first storage element;

outputting the address stored in the second storage element;

updating the address in the second storage element with a next address of the second subset;

iteratively repeating the steps of outputting the address stored in the first storage element, outputting the address stored in the second storage element, and updating the address in the second storage element, until the second storage element has been updated with a predetermined number of next addresses to generate a first sequence of addresses, wherein adjacent addresses in the first sequence of addresses create a corresponding transition pair of a source address and a destination address, wherein each unique address of the set is the source address in multiple transition pairs and each of the multiple transition pairs having a same unique address of the set as the source address has a different one of other unique address of the set as the destination address; and testing the memory array with the generated first sequence of addresses during built-in self-test (BIST) mode of the memory array with a minimum number of address changes.

18. The method of claim 17, further comprising:

after generating the first sequence of addresses, updating the address in the first storage element with a next address of the first subset; and iteratively repeating the steps of outputting the address stored in the first storage element, outputting the address stored in the second storage element, and updating the address in the second storage element, until the second storage element has been updated with a predetermined number of next addresses to generate a second sequence of addresses.

19. The method of claim 18, wherein the first sequence and the second sequence are a first and second portion of a sequence of addresses, the sequence of addresses causing each unique address in the set of unique addresses of the memory array to transition only once.

\* \* \* \* \*